US006958935B2

United States Patent
Lee et al.

(10) Patent No.: US 6,958,935 B2
(45) Date of Patent: Oct. 25, 2005

(54) NONVOLATILE SEMICONDUCTOR MEMORY WITH X8/X16 OPERATION MODE USING ADDRESS CONTROL

(75) Inventors: Hyoung-Woo Lee, Seoul (KR); June Lee, Seoul (KR); Oh-Suk Kwon, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/835,148

(22) Filed: Apr. 28, 2004

(65) Prior Publication Data

US 2004/0257846 A1 Dec. 23, 2004

(30) Foreign Application Priority Data

Jun. 19, 2003 (KR) ................................. 10-2003-0039850

(51) Int. Cl.$^7$ ............................................... G11C 16/04
(52) U.S. Cl. ............................. 365/185.11; 365/185.33; 365/189.03; 365/230.03
(58) Field of Search ....................... 365/185.11, 185.17, 365/185.33, 189.03, 230.03

(56) References Cited

U.S. PATENT DOCUMENTS

| | | | |
|---|---|---|---|
| 5,537,351 A | * 7/1996 | Suwa et al. | ............ 365/189.02 |
| 5,764,590 A | * 6/1998 | Iwamoto et al. | ............ 365/233 |
| 5,926,420 A | * 7/1999 | Kim | ...................... 365/189.02 |
| 6,275,412 B1 | 8/2001 | Kasa et al. | ............ 365/185.01 |
| 6,335,901 B1 | * 1/2002 | Morita et al. | ................ 365/233 |
| 6,724,682 B2 | * 4/2004 | Lee et al. | .............. 365/230.06 |

FOREIGN PATENT DOCUMENTS

| | | |
|---|---|---|
| KR | 1997-59710 | 11/1997 |
| KR | 2002/0091932 | 12/2002 |
| KR | 1020020091932 | 12/2002 |

OTHER PUBLICATIONS

English language abstract of Korea Publication No. 1997-59710.
English language abstract of Korea Publication No. 1020020091932.

* cited by examiner

*Primary Examiner*—Son Mai
(74) *Attorney, Agent, or Firm*—Marger Johnson & McCollom, P.C.

(57) ABSTRACT

The present invention relates to a nonvolatile semiconductor memory, that is, a flash memory and especially to a NAND type flash memory device capable of selectively controlling data input/output units by an address control. In the NAND type flash memory device, a memory cell array is divided into a plurality of blocks, and a data input/output path is selectively controlled by a predetermined data rate option and introduced addresses to perform data input/output operations at a x8 or x16 speed in one chip.

23 Claims, 11 Drawing Sheets

NONVOLATILE SEMICONDUCTOR MEMORY WITH X8/X16 OPERATION MODE USING ADDRESS CONTROL

CROSS REFERENCE TO RELATED APPLICATIONS

This application claims priority under 35 USC § 119 to Korean Patent Application No. 2003-39850, filed on Jun. 19, 2003, the contents of which are herein incorporated by reference in their entirety.

FIELD OF THE INVENTION

The present invention generally relates to a flash memory (i.e., one of non-volatile semiconductor memories) devices and especially to NAND type flash memory devices capable of selectively controlling input/output of a data storage unit using addresses.

BACKGROUND OF THE INVENTION

A flash memory is capable of maintaining stored data without an external power supply. In addition, the flash memory can perform electrical erase and program operations freely even without additional refresh processes applied to the stored data. Since a NAND type flash memory has a string structure consisting of a plurality of flash memory cells connected in serial, the NAND type flash memory is suitable for a high integration and widely used in portable electronic apparatuses as a data storage.

With rapidly increasing use of data requiring large storage capacity, such as motion pictures, voices and graphics, the NAND type flash memory having high integration density has been more widely used.

The NAND type flash memory is characterized by several operation methods that draw clear line between flash memories and other memories apart from cell characteristics. One of the most critical characteristics for the NAND type flash memory in the ability to operate in the methods of a command preset and an address preset.

According to the command preset method, commands that are combinations of predetermined bits (e.g., 00h, 80h, etc.) are inputted into a chip through an I/O pin to determine a next operation. According to the address preset method, an address to read or write data is inputted into the chip directly before starting an operation.

The other memories such as SRAMs start to perform reading or writing operation of data as soon as an address and a clock for the operations are introduced. In contrast, the NAND type flash memory inputs a command to perform and an address into a chip using the above command preset method and the address preset method, and then performs the operation of reading or writing data if a clock is inputted. In the NAND type flash memory, there is clear interval between the time when data is inputted or outputted and the time when the address or command is introduced. Therefore, an input pin for introducing addresses or commands can be used in common with a data I/O pin.

FIG. 1 is a block diagram illustrating a conventional x8 NAND type flash memory.

As shown in FIG. 1, the conventional NAND type flash memory includes a memory cell array 100, a row selection circuit 101, a column selection circuit 103, a data latch circuit 102, a control circuit 104 and a data input/output circuit 105. The memory cell array 100 is a data storage, and the row selection circuit 101 selects a row of the memory cell array 100 according to row addresses A12 to A27. The column selection circuit 103 selects a column of the memory cell array 100 according to column addresses A0 to A11. The data latch circuit 102 latches the data of the memory cell array 100. The control circuit 104 controls operations inputting/outputting the data according to inputted clock signals nWE, nRE and nCE and control signals ALE, CLE and Command.

Conventional NAND type flash memory comprises eight data I/O pins I/O0~I/O7 coupled to the data I/O circuit 105, a plurality of clock signal nWE, nRE, nCE input pins and control signal ALE, CLE input pins. The data I/O pins I/O0~I/O7 are used for inputting the command and the address A0~A27 and for inputting/outputting data. The clock signal nWE, nRE, nCE input pins control memory operations, and the control signal ALE, CLE input pins determine a kind of the data inputted into the data I/O pins I/O0~I/O7. The clock signal nWE is used for a synchronization of the addresses, commands and data introduced in the memory. The clock signal nRE is used for a synchronization at the time of data read out, and the clock signal nCE is used for selecting an operation of memory chip. The address latch enable (ALE) signal is a control signal used for identifying the data transferred through the data I/O pins I/O0~I/O7 as an address. The command latch enable (CLE) signal is a control signal used for identifying the data transferred through the I/O pins I/O0~I/O7 as a command.

Conventionally, the command comprises 8-bits, such that the command may be inputted into the memory in one cycle, but the address comprises more than 8-bits, such that it is needed more than one cycle to input all the address as shown in the following Table 1.

TABLE 1

| Cycle | I/O 0 | I/O 1 | I/O 2 | I/O 3 | I/O 4 | I/O 5 | I/O 6 | I/O 7 |
|---|---|---|---|---|---|---|---|---|
| 1st | A0 | A1 | A2 | A3 | A4 | A5 | A6 | A7 |
| 2nd | A8 | A9 | A10 | A11 | L | L | L | L |
| 3rd | A12 | A13 | A14 | A15 | A16 | A17 | A18 | A19 |
| 4th | A20 | A21 | A22 | A23 | A24 | A25 | A26 | A27 |

The address A0~A11 in Table 1 is a column address for selecting a column of a memory cell array, and the address A12~A27 is a row address for selecting a raw. In addition, the signal introduced through the data I/O pins I/O4~I/O7 is usually set to a low level.

Meanwhile, if the number of the I/O pins is increased to sixteen and the device operates at a x16 speed, data being inputted or outputted in parallel becomes doubled and the time (cycles) for processing the same number of data decreases to half. Therefore, efficiency of inputting/outputting data can be doubled over x8 operation. The following Table 2 describes inputs of the address when the memory operates at a x16 speed.

TABLE 2

| Cycle | I/O 0 | I/O 1 | I/O 2 | I/O 3 | I/O 4 | I/O 5 | I/O 6 | I/O 7 | I/O 8~ I/O 15 |
|---|---|---|---|---|---|---|---|---|---|
| 1st | A0 | A1 | A2 | A3 | A4 | A5 | A6 | A7 | L |
| 2nd | A8 | A9 | A10 | L | L | L | L | L | L |
| 3rd | A11 | A12 | A13 | A14 | A15 | A16 | A17 | A18 | L |
| 4th | A19 | A20 | A21 | A22 | A23 | A24 | A25 | A26 | L |

As described in Table 2, even if the number of I/O pins is 16, only 8 pins I/O 0~I/O 7 are used for inputting the address. The I/O pins I/O 8~I/O 15 are used only in inputting/outputting data and usually set to a low level during the input of address. One (i.e., I/O 3 in second cycle) of the addresses used in the case of the ×16 speed operation decreases compared to the case of the ×8 speed operation because the number of data applied in serial decreases to half its number.

As explained above, the ×16 speed memory has double efficiency compared to the ×8 speed memory. However, ×8 or ×16 memory is selectively used in a process of fabricating products according to functions and needs of the products regardless of the input/output efficiency. Therefore, most enterprises fabricating memories produce both of ×8 and ×16 memories. However, the ×8 nonvolatile semiconductor memory and the ×16 nonvolatile semiconductor memory regime different fabrication processes. Therefore, the fabrication process may be inefficient.

SUMMARY OF THE INVENTION

It is therefore an aspect of embodiments of the invention to provide a nonvolatile semiconductor memory device for selectively determining the number of data bits inputted or outputted according to data rate option in one chip, and being capable of controlling data rate operation of the memory using addresses.

In accordance with the present invention, a nonvolatile semiconductor memory device comprises a memory cell array divided into a plurality of blocks; a data latch circuit for latching a cell of a predetermined address with respect to each block in the memory cell array; a data I/O part including a plurality of I/O pins; a column address register for outputting addresses introduced from the data I/O part to a column selection circuit according to a synchronization signal; a data rate option selector for generating a data rate control signal according to a predetermined speed option; a block selector for generating a plurality of block selection signals to select each block of the memory cell array in response to a predetermined block selection address from the column addresses register and the data rate control signal; a column selection circuit for selecting a data line to input or output data in response to column selection addresses, the block selection signals and the data rate control signal; a data I/O controller for selecting a data line to input or output data from/to the column selection circuit in response to the block selection signals and the data rate control signal.

DESCRIPTION OF THE EXEMPLARY EMBODIMENT

The present invention may be embodied in different forms and should not be construed as limited to the embodiments set forth herein. Rather, these embodiments are provided so that this disclosure will be thorough and complete, and will fully convey the scope of the invention to those skilled in the art.

Figure 1:
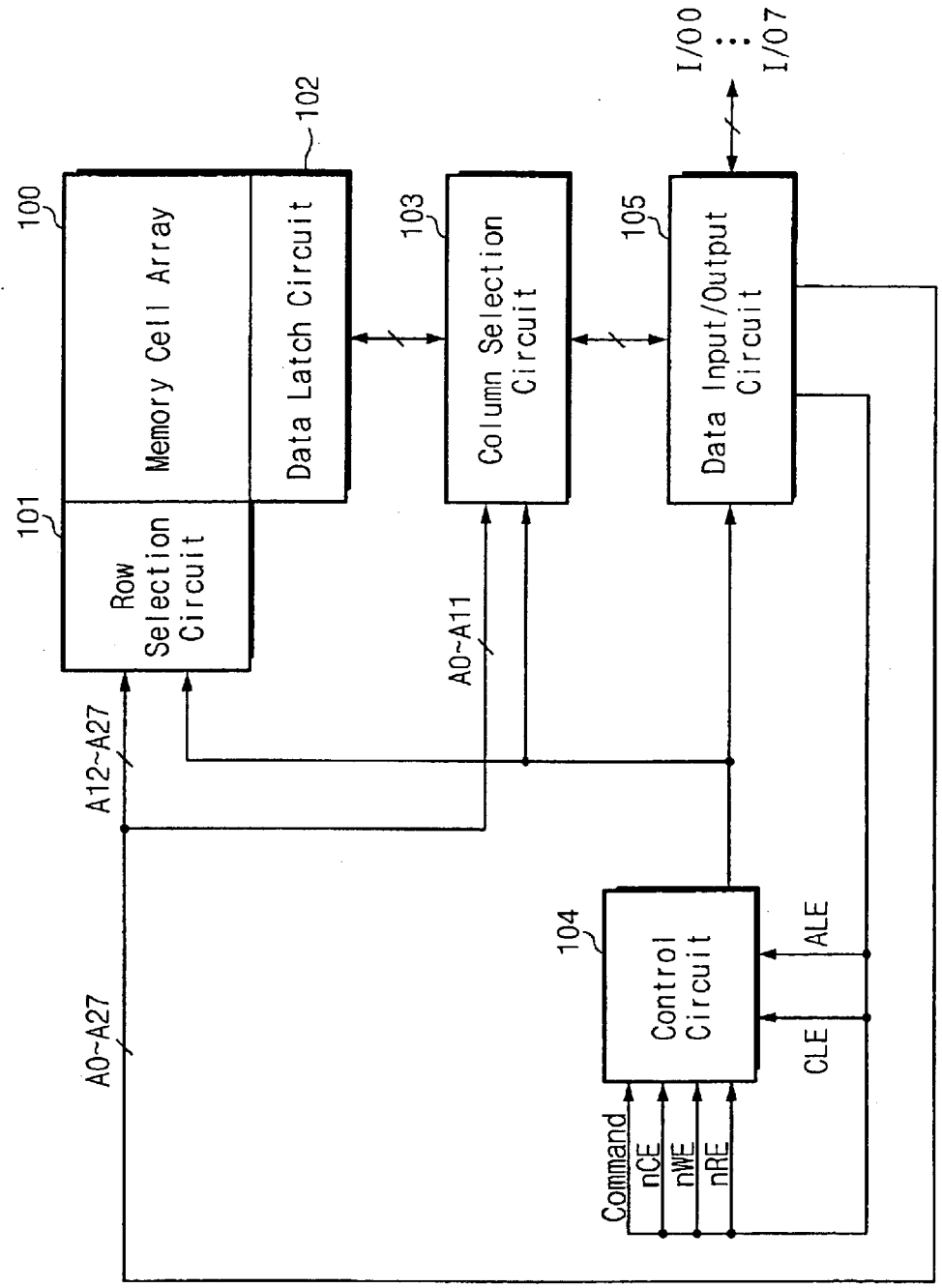
FIG. 1 is a block diagram showing a conventional ×8 speed NAND type flash memory.
Figure 2:
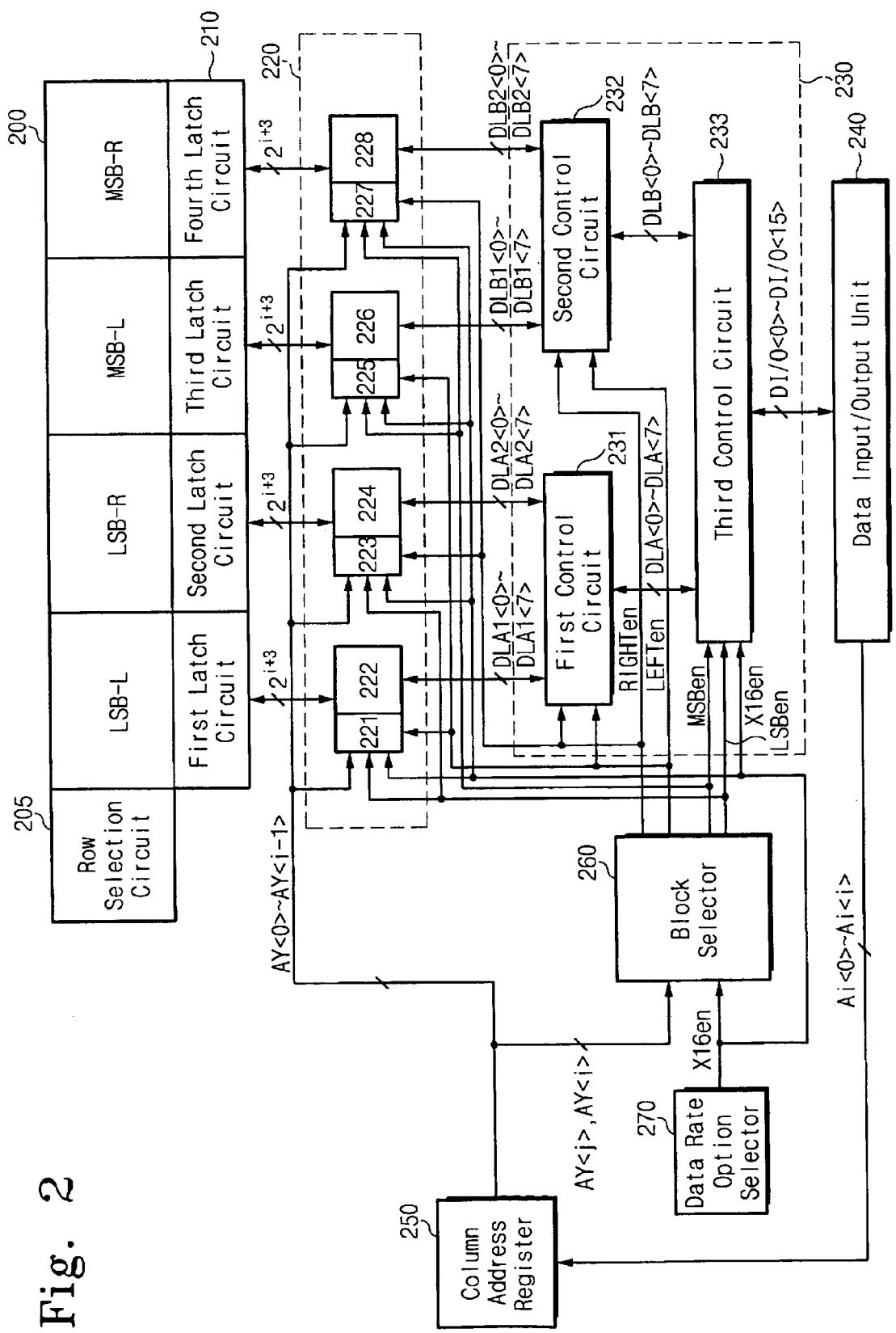
FIG. 2 is a block diagram showing a NAND type flash memory according to the invention having ×8 or ×16 data rate according to a predetermined data rate option.

FIG. 2 is a block diagram showing a NAND type flash memory having input/output of ×8 or ×16 data rate according to a predetermined data rate option.

The NAND type flash memory comprises a memory cell array 200, a row selection circuit 205, a data latch circuit 210, a data input/output part 240, a column address register 250, a data rate option selector 270, a block selector 260, a column selection circuit 220 and a data input/output controller 230. The memory cell array 200 comprises total four blocks LSB-L, LSB-R, MSB-L and MSB-R. The row selection circuit 205 is for selecting a row of the memory cell array 200. The data latch circuit 210 includes First-Fourth latching circuits for latching data to each of the memory cell blocks LSB-L, LSB-R, MSB-L and MSB-R. The data input/output unit 240 includes 16 I/O pins I/O 0~I/O 15. The column address register 250 stores column addresses introduced from the I/O pins to output sequentially according to synchronization signals. A data rate option selector 270 generates data rate control signal ×16en for determining the number of data bits inputted or outputted according to the predetermined data rate option. The block selector 260 generates four block selection signals LEFTen, RIGHTen, LSBen and MSBen for selecting each block of the memory cell array 200 in response to block selection addresses (AY<j>, AY<i> and 0≦j<i-3) from the column addresses (AY<0>~AY<i>) outputted from the column address register 250 and a data rate control signal ×16en.

The column selection circuit 220 determines a data line for a data input/output in response to column selection addresses (AY<0>~AY<i-1>outputted from the column address register 250 and, a data rate control signal ×16en and block selection signals LEFTen, RIGHTen, LSBen and MSBen from block selection 260, and outputs data from the data latch circuit to the selected data line. The data I/O controller 230 selects a data line for a data input/output between the column selection circuit 220 and the data I/O unit 240 in response to the block selection signals LEFTen, RIGHTen, LSBen and MSBen and the data rate control signal ×16en. The structure and operation of column selection circuit 220 and data I/O controller 230 and further explained below with reference to Figs.

As shown in FIG. 2, the memory cell array 200 is roughly divided into an LSB block LSB and an MSB block MSB, and each of the blocks LSB and MSB are divided into a left block LSB-L and MSB-L and a right block LSB-R and MSB-R. The data latch circuit 210 is connected to each of the blocks.

The data I/O unit 240 including total 16 I/O pins I/O 0~I/O 15 uses only 8 pins I/O 0~I/O 7 during data input/ output operating at a ×8 speed and all the 16 pins I/O 0~I/O 15 during data input/output operating at a ×16 speed. The data I/O unit 240, however, uses only 8 pins I/O 0~I/O 7 regardless of the data rates ×8 or ×16 during address input.

Figure 3:
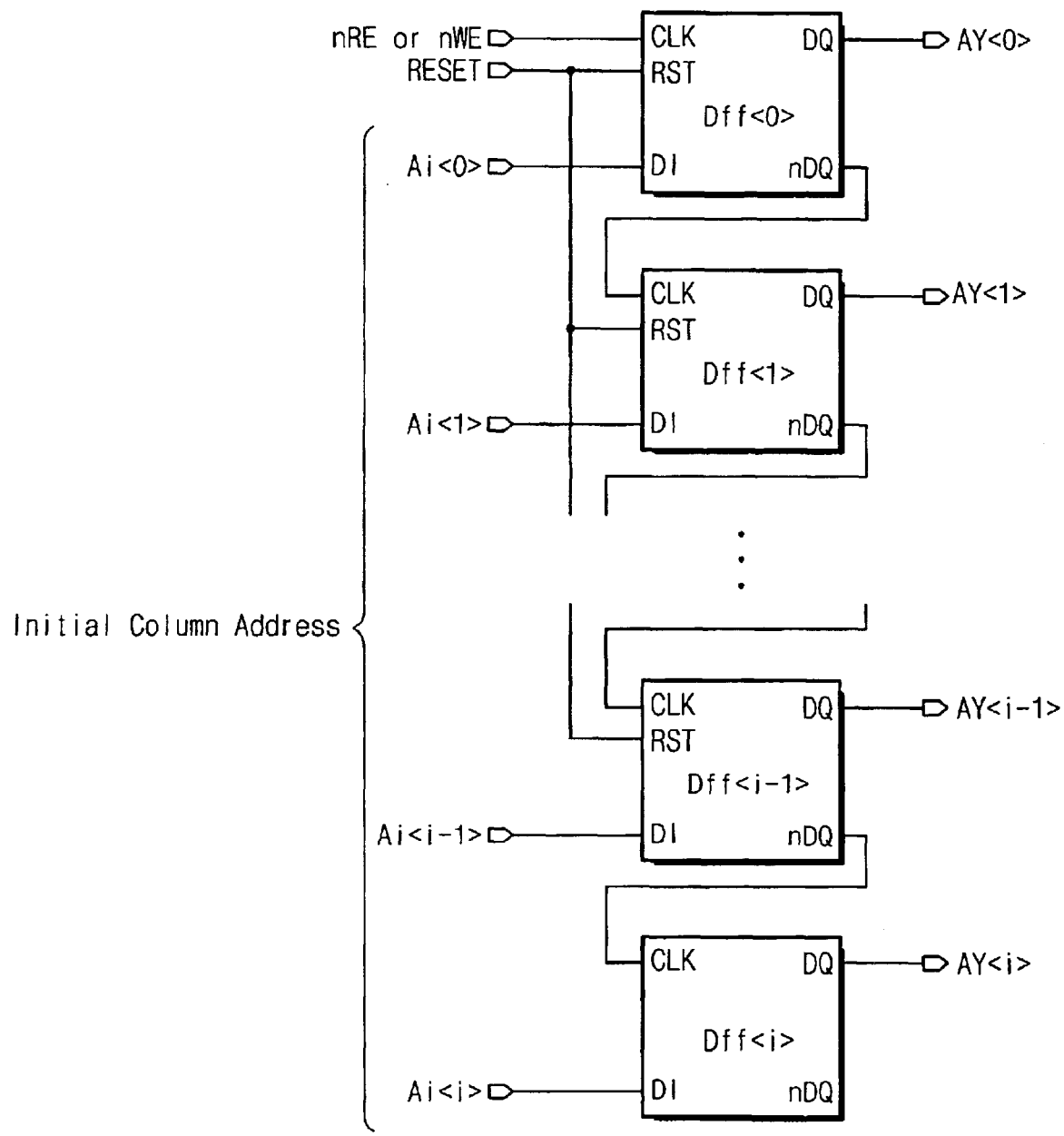
FIG. 3 is a circuit diagram showing a column address register of FIG. 2.

FIG. 3 is a circuit diagram showing a column address register 250 of FIG. 2. As illustrated in FIG. 3, the column address register 250 includes D-flipflops DFF<0>~DFF<i> as many as the number of introduced initial column addresses Ai<0>~Ai<i>, and counts one by one according to a synchronized signal nRE or nWE inputted from the data input/output part 240 to output sequentially.

Figure 4A:
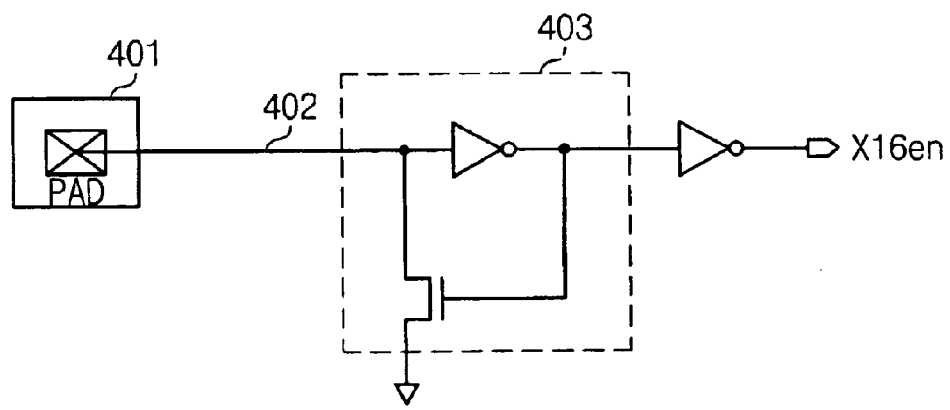
FIG. 4A is a circuit diagram showing a data rate option selector of FIG. 2.

FIG. 4A is a circuit diagram showing an embodiment of the data rate option selector 270 of FIG. 2. In the embodiment illustrated in FIG. 4A, the data rate option selector 270 generates a data rate control signal ×16en for determining a data rate inputted or outputted according to bonding states of a pad 401 and a wire 402, and maintains the data rate control signal ×16en generated through the latch circuit 403. If the pad and wire are bonded, the data rate control signal ×16en becomes a high level and the flash memory of FIG. 2 operates at ×16 speed. If the pad and the wire are not bonded, the data rate control signal ×16en becomes a low level and the flash memory operates at ×8 speed.

Figure 4B:
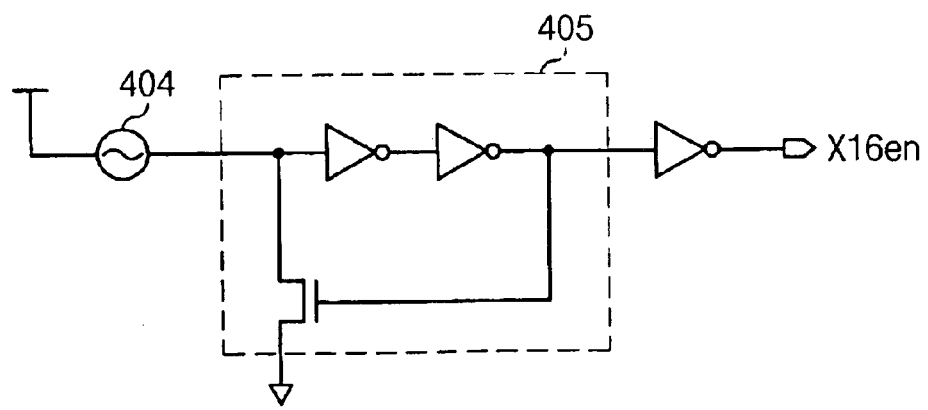
FIG. 4B is a circuit diagram showing another embodiment of the data rate option selector of FIG. 2.

FIG. 4B is a circuit diagram showing another embodiment of the data rate option selector 270. In the embodiment of FIG. 4B, the data rate option selector 270 generates a data rate signal ×16en for determining data rate of input/output according to a state of a fuse 404, and maintains the data rate control signal ×16en generated through a latch circuit 405. If the fuse 404 is cut off, the data rate control signal ×16en becomes a high level by inverters connected in serial and the flash memory operates at ×16 speed. If the fuse 403 is connected, the data rate control signal ×16en becomes a low level and the flash memory operates at ×8 speed.

Figure 5:
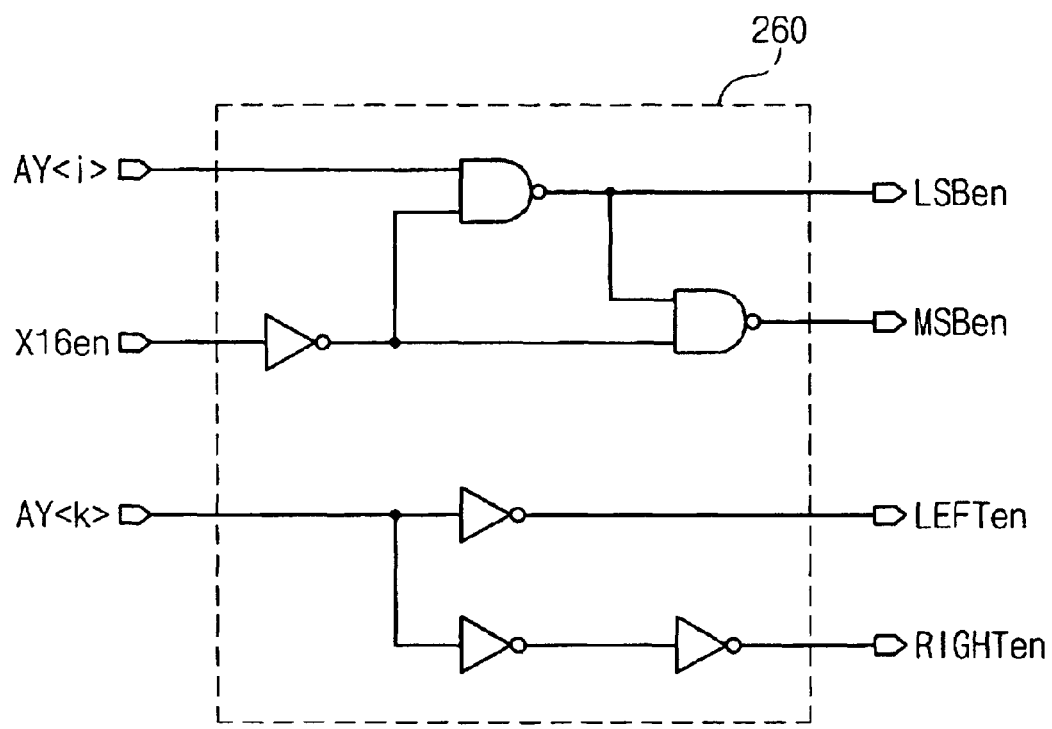
FIG. 5 is a circuit diagram showing a block selector of FIG. 2.

FIG. 5 is circuit diagram illustrating an embodiment of the block selector 260 of FIG. 2. As shown in FIG. 5, the block selector 260 generates block selection signals MSBen, LSBen, LEFTen and RIGHTen for selecting each block of the cell array 200 in response to the block selection address AY<j> and AY<i> and the data rate control signal ×16en by a combination of a plurality of logic circuits. The following Table 3 describes outputs of the block selector 260 according to each of the signals AY<j>, AY<i>, ×16en and selection blocks in each case.

TABLE 3

| X16en | AY <j> | AY <i> | LSBen | MSBen | LEFTen | RIGHTen | Selection block |
|---|---|---|---|---|---|---|---|
| low | Low | low | high | low | high | low | LSB-L |
| low | Low | high | high | low | low | high | LSB-R |
| low | High | low | low | high | high | low | MSB-L |
| low | High | high | low | high | low | high | MSB-R |
| high | X | low | high | high | high | low | MSB-L, LSB-L |
| high | X | high | high | high | low | high | MSB-R, LSB-R |

As described in Table 3, if the memory operates at a ×16 speed (i.e., the data rate control signal ×16en has a high level), the block selector 260 generates block selection signals MSBen=high and LSBen=high to select all the LSB and MSB blocks, and doesn't care when the inputted first block selection address AY<j>. The block selector 260 generates block selection signals LEFTen and RIGHTen for selecting left or right block of the LSB and MSB blocks according to the second block selection address AY<i>. For example, AY<i> is a low level, the left blocks of the memory cell (i.e., MSB-L block and LSB-L block) are selected. If the second block selection address AY<i> is a high level, the right blocks (i.e., MSB-R and LSB-R blocks) are selected. In addition, if the memory operates at ×8 speed (i.e., the data rate control signal ×16en is a low level), the block selector 260 generates the block selection signals according to the block selection addresses AY<j> and AY<i>, as described in Table 3. Therefore, one of the four blocks in the memory is selected.

The column selection circuit 220 in FIG. 2 comprises column selection circuits including column decoder circuits 222, 224, 226 and 228 and column predecoder circuits 221, 223, 225 and 227. In addition, each of the column predecoder circuit comprises a first predecoder circuit and a second predecoder circuit.

Figure 6A:
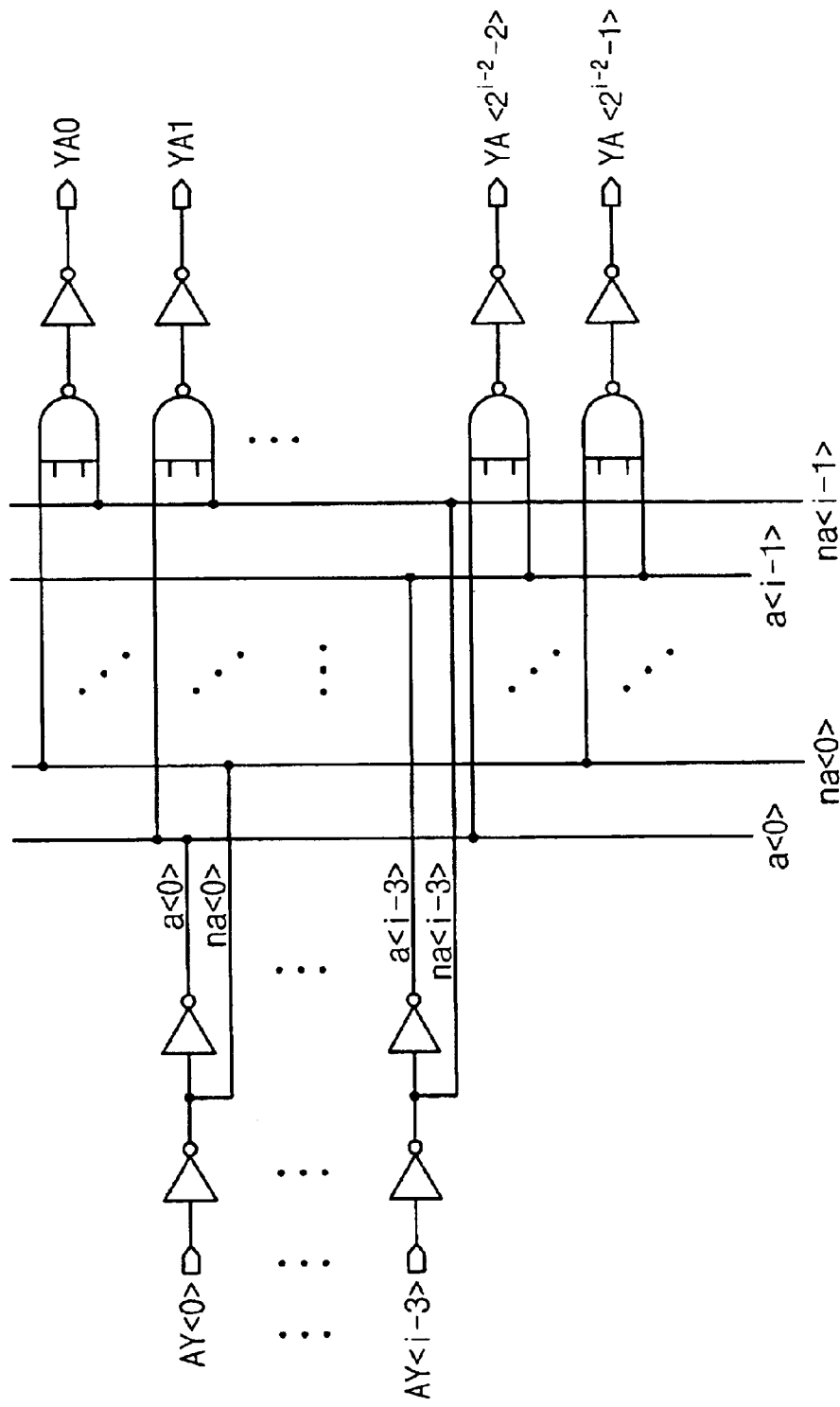
FIG. 6A is a circuit diagram showing a first used in the column predecoder circuit.
Figure 6B:
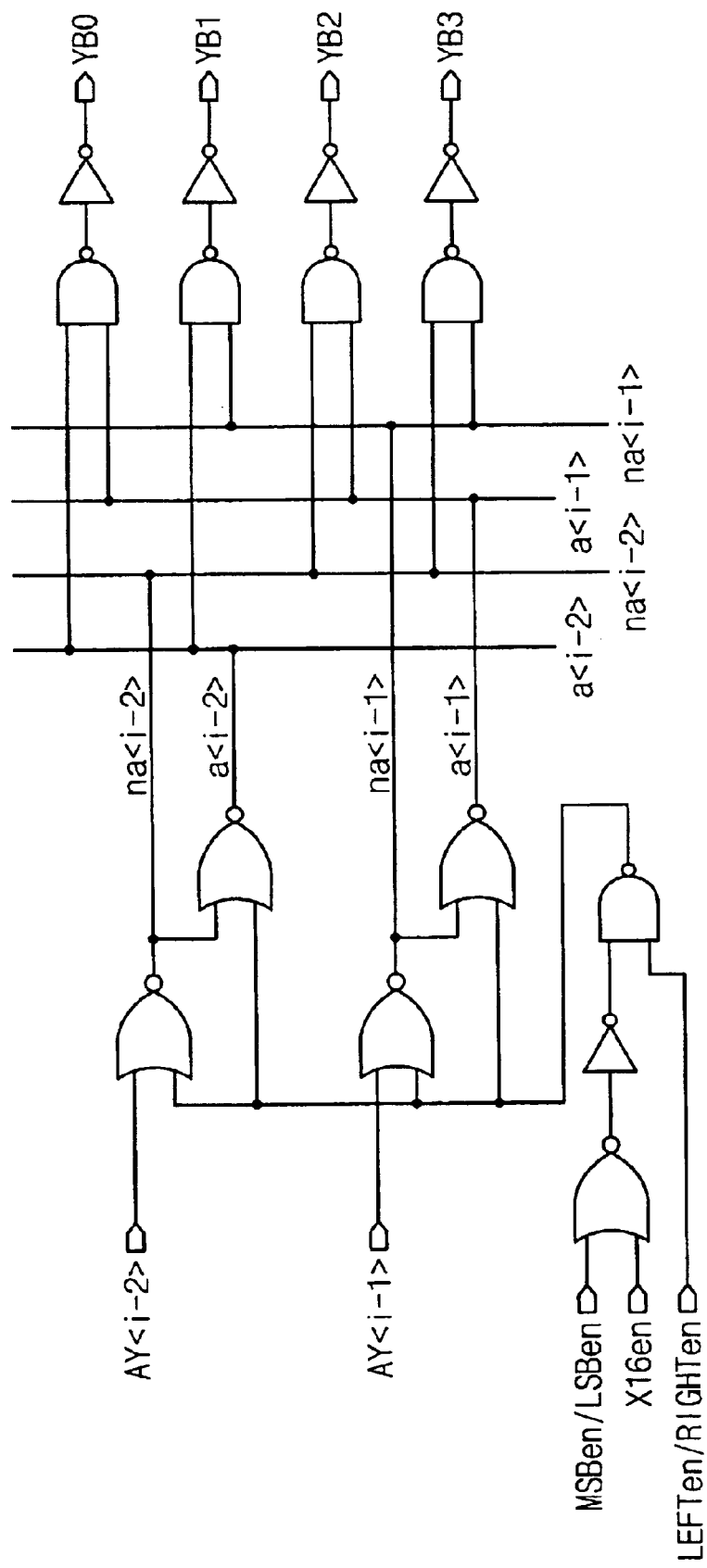
FIG. 6B is a circuit diagram showing a second predecoder circuit in FIG. 2. selection circuit of FIG. 2.

FIG. 6A is a circuit diagram showing an embodiment of the first predecoder circuit of the present invention. FIG. 6B is a circuit diagram showing an embodiment of the second predecoder circuit.

Referring to FIG. 6A, the first predecoder circuit generates latch signals YA0~YA<2i-2-1>for predecoding the column selection addresses AY<0>~AY<i-3>but AY<j> to input to the column decoder circuits 222, 224, 226 and 228. The second predecoder circuit, as shown in FIG. 6B, generates gate control signals YB 0~YB 3 for setting data input/output path of the column decoder circuit according to the gate selection addresses AY<i-1>and AY<i-2>from column selection address, block selection signals MSBen or LSBen and LEFTen or RIGHTen and the data rate control signal ×16en.

Each block of the memory cell array has an independent column predecoder circuit illustrated in FIGS. 6A and 6B each having an identical circuit organization. Referring to FIGS. 6A and 6B, if the LSB-L block of the memory cell array 200 is selected (LSBen=high, LEFTen=high and the rest of the block selection signals has a low level) when the memory operates at ×8 speed, a second predecoder circuit of the column predecoder circuit to the LSB-L block generates gate control signals YB 0~YB 3 according to the introduced gate selection addresses AY<i-2>and AY<i-1>. A first predecoder circuit for the rest of blocks LSB-R, MSB-L and MSB-R generates gate control signals YB 0~YB 3 that have a low level regardless of the gate selection addresses by the block selection signals.

Figure 7:
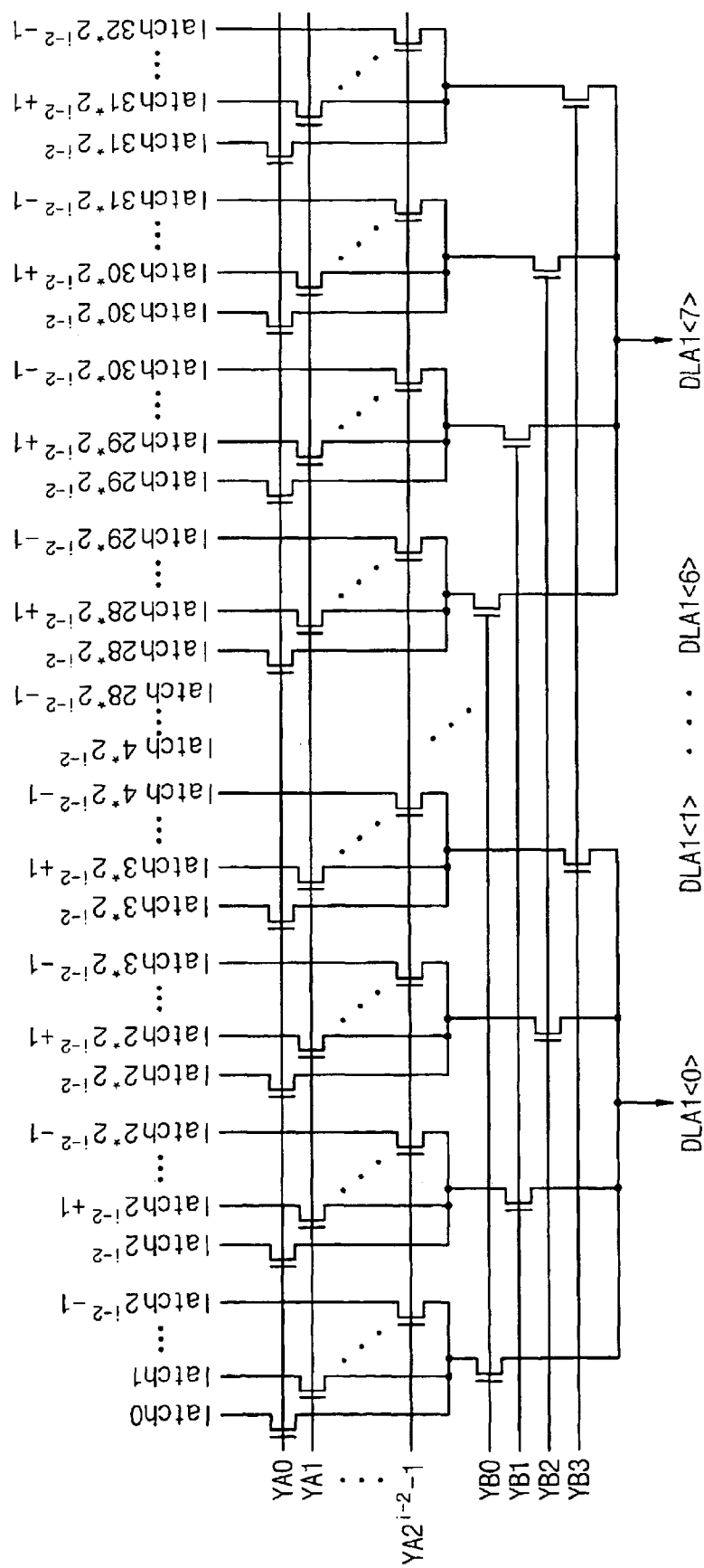
FIG. 7 is a circuit diagram showing a column decoder circuit used in the column selection circuit of FIG. 2.

FIG. 7 is a circuit diagram illustrating embodiments of the column decoder circuits 222, 224, 226 and 228. The blocks of the memory cell array 200 have independent column decoder circuits 222, 224, 226 and 228 respectively, each having an identical circuit construction corresponding to those of FIGS. 6A and 6B. Each of the column decoder circuits 222, 224, 226 and 228 outputs the data latched by the data latch circuit 210 to a data line selected from the data lines DLA1~DLA4 according to the gate control signals YB 0~YB 3 generated by each of the column predecoder circuit 221, 223, 225 and 227. If all the low gate control signals YB 0~YB 3 are introduced in the column decoder circuit, the data line is interrupted by a MOS transistor 30 as not to output data.

Figure 8A:
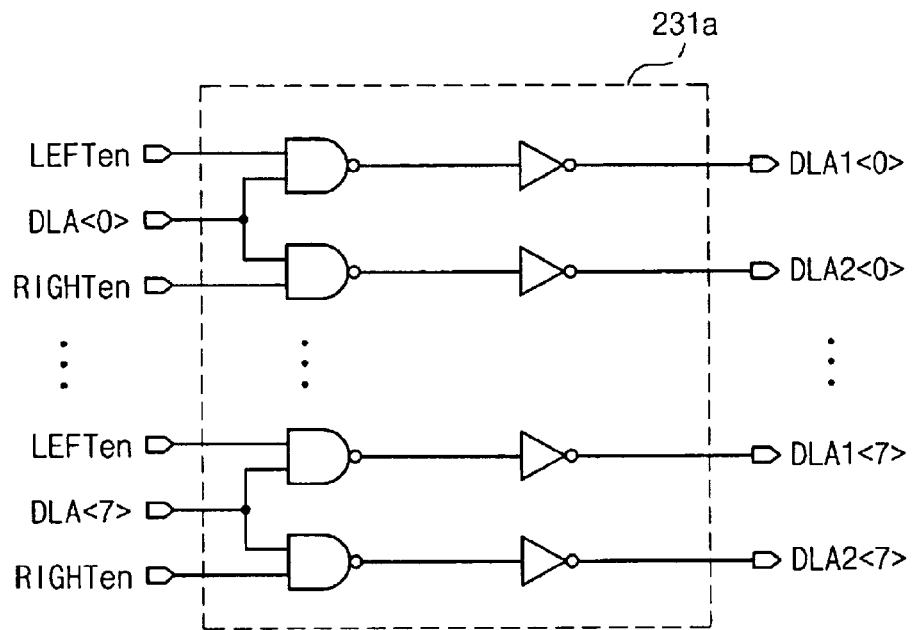
FIG. 8A is a circuit diagram showing a data input circuit of first and second control circuit of FIG. 2.
Figure 8B:
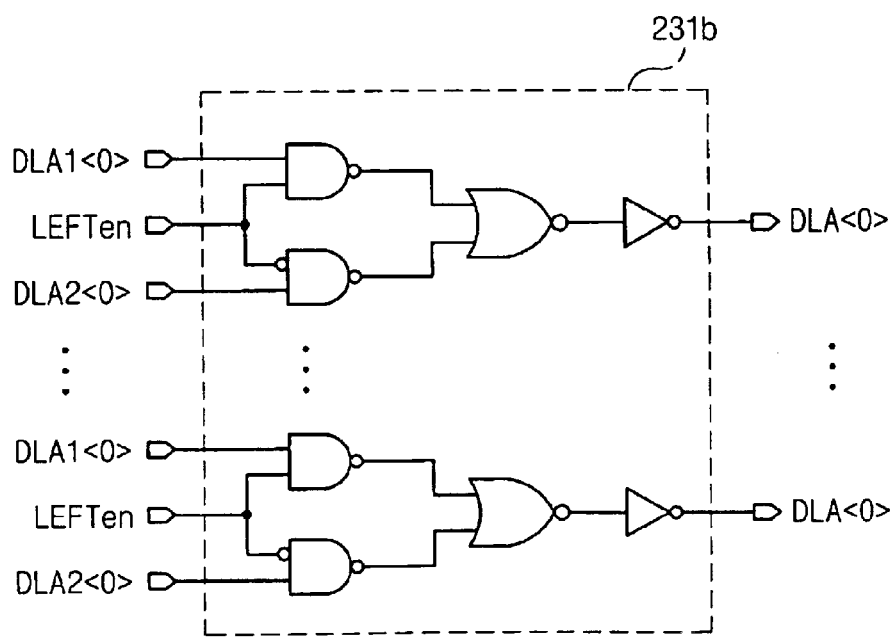
FIG. 8B is a circuit diagram showing a data output circuit of first and second control circuit of FIG. 2.

FIG. 8A is a circuit diagram showing an embodiment of data input circuit 231a in a first control circuit 231. FIG. 8B is a circuit diagram showing an embodiment of a data output circuit 231b in the first control circuit 231. The first control circuit 231 includes the data input circuit 231a and the data output circuit 231b that are illustrated in FIGS. 8A and 8B, respectively. Referring to FIGS. 8A and 8B, the first control circuit 231 inputs or outputs data through the data line selected by the block selector 260 according to left or right block selection signals LEFTen and RIGHTen. Referring to FIG. 8A, the data input circuit 231a of the first control circuit 231 selects data lines DLA1 and DLA2 being used according to the left or right block selection signals LEFTen and RIGHTen. If both the left and write block selection signals LEFTen and RIGHTEn are enabled (i.e., LEFTen=high and RIGHTen=high), the data DLA<0>~DLA<7> introduced through a data line A DLA are outputted to all data lines A1 and A2 (DLA1 and DLA2). Moreover, if only the left block selection signal LEFTen is enabled (i.e., LEFTen=high and RIGHTen=low), the data line A2 (DLA2) is set to a low level and the data DLA<0>~DLA<7> inputted through the data line A (DLA) are inputted only through the data line A1 (DLA1).

Referring to FIG. 8B, the data output circuit 231b of the first control circuit 231 selects one of the data line A1 (DLA1) and the data line A2 (DLA2) according to the left block selection signal LEFTen and outputs data through the data line A DLA. The second control circuit 232 may be the same as the fully explained first control circuit 231 in the circuit organization and operations thereof and will not be further explained herein.

Figure 9A:
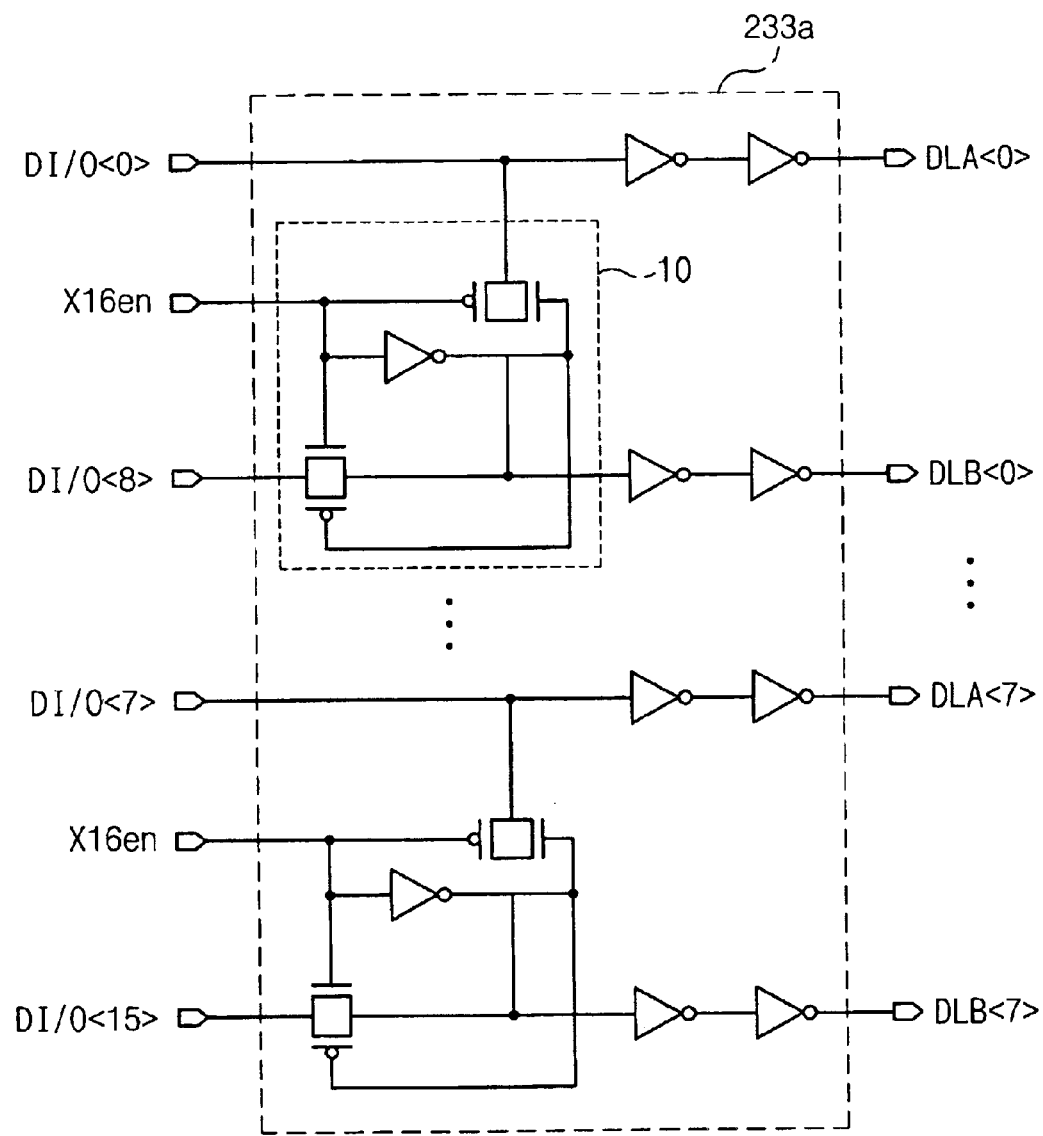
FIG. 9A is a circuit diagram showing a data input circuit of third control circuit of FIG. 2.
Figure 9B:
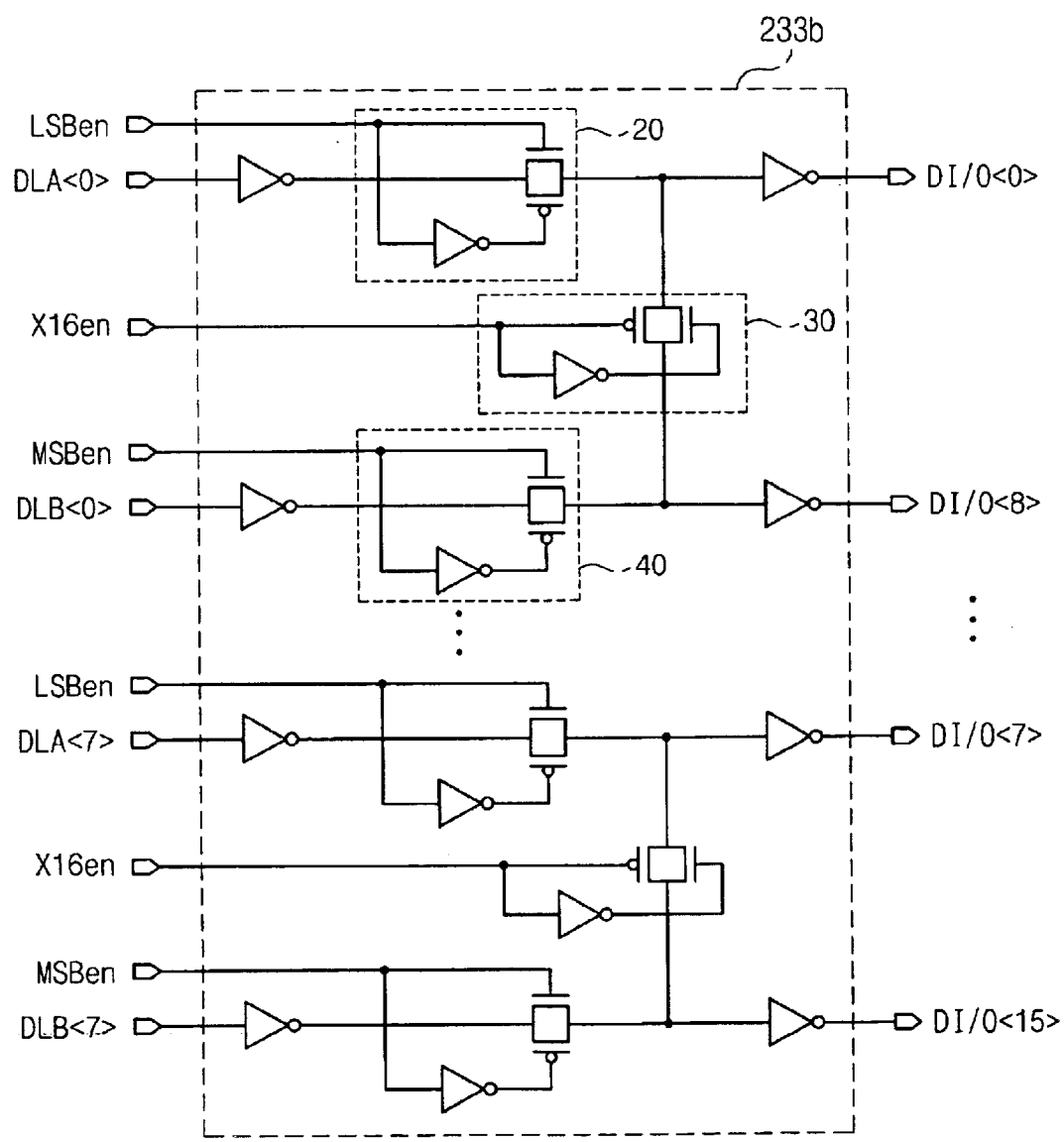
FIG. 9B is a circuit diagram showing a data output circuit of the third control circuit of FIG. 2.

FIG. 9A is a circuit diagram showing an embodiment of the data input circuit 233a in a third control circuit 233 of the present invention. FIG. 9B is a circuit diagram showing a data output circuit 233b in the third control circuit 233. The third control circuit 233 includes the data input circuit 233a and the data output circuit 233b that are illustrated in FIGS. 9A and 9B. Referring to FIGS. 9A and 9B, the third control circuit 233 inputs or outputs data through a data line enabled by the block selector 260. Referring to FIG. 9A, when the memory operates at a ×16 speed (i.e., ×16en=high), data lines DLA and DLB are separated form each other by the data line control circuit 10 including a MOS transistor and an inverter, and the data DI/O<0>~DI/O<15> are introduced into the memory through each of the data lines DLA and DLB in a data input circuit 233a of the third control circuit 233. When the memory operates at a ×8 speed (i.e., ×16en=low), the two data lines DLA and DLB are connected by the data line control circuit 10 and the data inputted through 8 backside data I/O pins I/O 8~I/O 15 are interrupted, such that only the data DI/O<0>~DI/O7> inputted through 8 front side data I/O pins I/O 0~I/O 7 are inputted equally through the two data lines DLA and DLB. However, one of the data lines DLA and DLB is interrupted by the above predecoder circuits 221, 223, 225 and 227 and the column decoder circuits 222, 224, 226 and 228 and the other line is used for inputting data.

Referring to FIG. 9B, when the data output circuit 233b of the third control circuit 233 operates at a ×16 speed (i.e., ×16en=high, MSBen=high and LSBen=high), the data lines are separated into two independent data lines DI/O<0>~DI/O<7> and DI/O<8>~DI/O<15>by the first data line control circuit 30, and each of the data lines DI/O<0>~DI/O<7> and DI/O<8>~DI/O<15> are connected to the data I/O pins by the second data line control circuit 20 and the third data line control circuit 40 to output the 16 different data DI/O<0>~DI/O<15> to the data I/O pins I/O 0~I/O 15. When the data output circuit 233b operates at ×8 speed (i.e., ×16en=low), the two data lines DLA and DLB are connected to each other by the first data line control circuit 30, and 8 data are outputted only through the data line DLA or DLB selected according to the block selection signals MSBen and LSBen. For example, if the LSB block is selected (i.e., LSBen=high and MSBen=low), the data line A (DLA) is connected to the data I/O pin by the second data line control circuit 20, the data line B (DLB) is interrupted by the third data line control circuit 40 to output only the data introduced through the data line A (DLA) to the I/O pins. Conversely, if the MSB block is selected (i.e., LSBen=low and MSBen=high), the data line A (DLA) is interrupted by the data line control circuits 20, 30 and 40 and the data inputted through the data line B (DLB) are outputted to the pins.

According to the present invention, the nonvolatile semiconductor memory device can operate at ×8 speed or ×16 speed depending on options in one chip and control data input/output with respect to each operation having different data rate.

While this invention has been particularly shown and described with reference to, the preferred embodiments thereof, it will be understood by those skilled in the art that various changes in form and details may be made without departing from the spirit and scope of this invention.

What is claimed is:

1. A nonvolatile semiconductor memory device including a plurality of data I/O pins, comprising:
   a memory cell array divided into a plurality of blocks;
   a data rate option selector for generating a data rate control signal according to a predetermined speed option;
   a block selector for generating a plurality of block selection signals to select a block of the memory cell array in response to a predetermined block selection address from column addresses introduced through the I/O pins and the data rate control signal;
   a column selection circuit for selecting a data line in response to a predetermined column selection address from the column addresses, the block selection signals and the data rate control signal and for outputting data of the memory cell array to the selected data line; and
   a data I/O controller for selecting a data line to input data to, or output data from, the column selection circuit in response to the block selection signals and the data rate control signal.

2. The device of claim 1, wherein the memory cell array is divided into 4 blocks.

3. The device of claim 1, wherein the nonvolatile semiconductor memory includes 16 data I/O pins.

4. The device of claim 1, wherein the data I/O pins are selected according to the data rate control signal.

5. The device of claim 1, wherein the column addresses include block selection addresses and column selection addresses.

6. The device of claim 5, wherein the block selection addresses are inputted to the block selector.

7. The device of claim 1, wherein the data rate control signal is a signal for determining the number of data bits inputted or outputted according to the data rate option.

8. The device of claim 1, wherein the block selector generates first through fourth block selection signals for selecting each block of the memory cell array, and selects blocks of the memory cell array by a combination of the data rate control signal, the first through fourth block selection signals and the block selection addresses.

9. The device of claim 1, wherein each of the blocks of the memory cell array have a corresponding one of the column selection circuits each having a respective column decoder circuit and column predecoder circuit.

10. The device of claim 9, wherein the column predecoder circuit comprises:
    a first predecoder circuit for predecoding introduced column selection addresses to generate one or more latch control signals; and a second column predecoder circuit for generating one or more gate control signals in response to predetermined column selection addresses from the column selection addresses, the block selections signals and the data rate control signal.

11. The device of claim 10, wherein one or more of the gate control signals select a data line for inputting/outputting data from/to the column decoder circuit.

12. The device of claim 9, wherein the column decoder circuit outputs the data from the memory cell array to the selected data line in response to one or more the latch control signal and the gate control signals.

13. The device of claim 1, wherein the data input/output controller comprises:

a first control circuit for selecting a data line to input/output data in response to the first of the block selection signals and second of the block selection signals;

a second control circuit for selecting a data line to input/output data in response to the first block selection signal and the second block selection signal; and a third control circuit for selecting a data line to input/output data in response to the data rate control signal, a third of the block selection signals and a fourth of the block selection signal.

14. The device of claim 13, wherein the first control circuit comprises:

a first data input circuit for selecting a data line to input data in response to the first block selection signal and the second block selection signal; and a first data output circuit for selecting a data line for outputting data in response to the first block selection signal.

15. The device of claim 13, wherein the second control circuit comprises:

a second data input circuit for selecting a data line to input data in response to the first block selection signal and the second block selection signal; and a second data ouput circuit for selecting a data line for outputting data in response to the first block selection signal.

16. The device of claim 13, wherein the third control circuit comprises:

a third data input circuit for selecting a data line to input data in response to the data rate control signal; and a third data output circuit for selecting a data line to output data in response to the data rate control signal, the third block selection signal and the fourth block selection signal.

17. A nonvolatile semiconductor memory device comprising:

a memory cell array divided into 4 blocks;

a data I/O part including 16 data I/O pins;

a column address register for sequentially outputting column addresses introduced from the data input/output part according to a synchronization signal;

a data rate option selector for generating one of an x8 or x16 data rate control signal according to a preset data rate option;

a block selector for generating first through fourth block selection signals to select a block in the memory cell array in response to one or more block selection addresses from the column address register and the data rate control signal;

a column selection circuit for selecting a data line to input/output data in response to the column selection addresses from the column address register, the first through fourth block selection signals and the data rate control signal, and for outputting the data in the memory to the selected data line;

a first control circuit for selecting a data line to input/output data in response to the first block selection signal and the second block selection signal; and a second control circuit for selecting a data line to input/output data in response to the data rate control signal, the third block selection signal and the fourth block selection signal.

18. The device of claim 17, wherein the data rate control signal determines the number of data bits inputted or outputted according to the data rate option.

19. The device of claim 17, wherein the first control circuit comprises:

a first data input circuit for selecting a data line to input data in response to the first block selection signal and the second block selection signal; and a first data output circuit for selecting a data line to output data in response to the first block selection signal.

20. The device of claim 17, wherein the second control circuit comprises:

a second data input circuit for selecting a data line to input data in response to the data rate control signal; and a second data output circuit for selecting a data line to output data in response to the data rate control signal, the third block selection signal and the fourth block selection signal.

21. The device of claim 17, wherein the blocks of memory cell array each have a corresponding one of the column selection circuit, each having a respective column decoder circuit and column predecoder circuit.

22. The device of claim 21, wherein the column predecoder circuit comprises:

a first predecoder circuit for predecoding the introduced column selection addresses to generate one or more latch control signals; and a second column predecoder circuit for generating one or more gate control signals in response to predetermined column selection addresses from the column selection addresses, the block selection signals and the data rate control signal.

23. The device of claim 22, wherein one or more the gate control signals select a data line for inputting/outputting data of the column decoder circuit.

* * * * *

UNITED STATES PATENT AND TRADEMARK OFFICE
CERTIFICATE OF CORRECTION

PATENT NO.       : 6,958,935 B2                                              Page 1 of 1
APPLICATION NO.  : 10/835148
DATED            : October 25, 2005
INVENTOR(S)      : Lee et al.

It is certified that error appears in the above-identified patent and that said Letters Patent is hereby corrected as shown below:

At column 7, line 44 please replace "~DI/O7>" with --~DI/O<7>--

At column 9, line 11, please replace "one or more the latch" with --one or more of the latch--

At column 10, line 56, please replace "one or more the gate" with --one or more of the gate--

Signed and Sealed this

Twenty-sixth Day of December, 2006

JON W. DUDAS
*Director of the United States Patent and Trademark Office*